(12) United States Patent
Sumiya et al.

(10) Patent No.: US 6,875,366 B2
(45) Date of Patent: Apr. 5, 2005

(54) PLASMA PROCESSING APPARATUS AND METHOD WITH CONTROLLED BIASING FUNCTIONS

(75) Inventors: Masahiro Sumiya, Kudamatsu (JP); Naoki Yasui, Kudamatsu (JP); Seiichi Watanabe, Tokuyama (JP)

(73) Assignee: Hitachi, Ltd., Tokyo (JP)

( * ) Notice: Subject to any disclaimer, the term of this patent is extended or adjusted under 35 U.S.C. 154(b) by 244 days.

(21) Appl. No.: 09/946,491

(22) Filed: Sep. 6, 2001

(65) Prior Publication Data

US 2002/0031617 A1 Mar. 14, 2002

(30) Foreign Application Priority Data

Sep. 12, 2000 (JP) .................................... 2000-276667

(51) Int. Cl.[7] ............................................. H01L 21/00
(52) U.S. Cl. ...................... 216/67; 134/1.1; 134/22.1; 438/710; 438/714
(58) Field of Search .......................... 216/67; 438/710; 134/1.1, 22.1

(56) References Cited

U.S. PATENT DOCUMENTS

| | | | | |
|---|---|---|---|---|
| 5,779,925 A | * | 7/1998 | Hashimoto et al. ............ 216/67 |
| 5,882,424 A | * | 3/1999 | Taylor et al. ................. 134/1.1 |
| 5,891,252 A | | 4/1999 | Yokogawa et al. |
| 6,070,550 A | * | 6/2000 | Ravi et al. ................. 118/723 E |
| 6,129,806 A | * | 10/2000 | Kaji et al. ............. 156/345.46 |

OTHER PUBLICATIONS

"Introduction to Plasma Physics and Controlled Fusion", by F. F. Chen, published by Plenum Press, pp. 169–172, 1974.

* cited by examiner

*Primary Examiner*—Allan Olsen
(74) *Attorney, Agent, or Firm*—Antonelli, Terry, Stout & Kraus, LLP

(57) ABSTRACT

Processing technique using plasma to process the surface of a sample such as semiconductor device. The phases of RF bias voltages applied to a substrate electrode and an antenna electrode opposed thereto are controlled to be opposite to each other so that either one of the electrodes is forced to always function as ground. Therefore, the current flowing to cross the magnetic field for controlling the plasma is decreased, and the potential distribution difference in the surface of the sample to be processed is reduced, so that the charging damage can be suppressed. Energy of ions incident to the sample to be processed can be controlled to perform high-precision etching. The plasma potential can also be controlled so that the strength of the ion impact to the inner wall of the chamber can be reduced, thereby reducing particles detached from the inner wall of the processing apparatus to improve the throughput.

17 Claims, 6 Drawing Sheets

DEPENDENCE OF ION ENERGY
DISTRIBUTION ON PHASE DIFFERENCE

DEPENDENCE OF $\delta$Vdc ON
PHASE DIFFERENCE

PLASMA PROCESSING APPARATUS AND METHOD WITH CONTROLLED BIASING FUNCTIONS

BACKGROUND OF THE INVENTION

1. Field of the Invention

The present invention relates to plasma processing apparatus and method, and particularly to a plasma processing apparatus and method suitable for making surface treatment of a sample such as a semiconductor device by use of plasma.

2. Description of the Related Art

In the plasma etching process, the processing gas is ionized to be activated for fast processing, and radio frequency (RF) biasing power is supplied to a sample to be processed (or a processed sample) so that the ions in the plasma can be incident perpendicularly to the sample to be processed, thereby achieving high-precision etching for anisotropic shape and so on.

A plasma processing apparatus for this purpose is disclosed in Yokogawa et al U.S. Pat. No. 5,891,252. This apparatus, as described in that document, has an air-core coil provided on the outer periphery of the outside of a vacuum vessel, and a circular conductor plate provided to oppose a wafer stage within the vacuum vessel. In addition, an UHF band power supply and a first RF power supply are connected to the circular conductor plate, while a second RF power supply is connected to the wafer stage, so that an electric field of UHF band and anther electric field of frequencies different from the UHF band are applied superimposed upon each other to the circular conductor plate. Thus, plasma is generated by use of electron cyclotron resonance due to the mutual action between the electromagnetic waves from the UHF band power supply and the magnetic field from the air-core coil. The superimposed RF voltage from the first RF power supply increases the bias voltage to the circular conductor plate so that the circular conductor plate and the plasma can be reacted to more produce activated species that contribute to the etching, and the second RF power supply connected to the wafer stage controls the energy of ions within the plasma, incident to the sample.

Also, it is generally known that in a plasma with a static magnetic field applied, the impedance of the plasma perpendicular to the magnetic filed is larger than that parallel to the field as described in "DIFFUSION ACROSS A MAGNETIC FIELD 5.5" in "INTRODUCTION TO PLASMA PHYSICS AND CONTROLLED FUSION" written by F. F. Chen, and published by Plenum Press, PP. 169–172, 1974.

SUMMARY OF THE INVENTION

In the above plasma processing apparatus, since the electric path of the RF power supplied to the sample to be processed propagates to cross the magnetic field, the impedance of the plasma perpendicular to this magnetic field may act to form a potential distribution in the surface of the sample to be processed, which causes charging damage. In addition, the energy of ions incident to the sample to be processed is determined by the self-bias potential due to the biasing power fed to the sample to be processed, and there is the problem that the efficiency of the bias application is reduced since the rate of the earth area to the substrate electrode is decreased with the increase of the wafer size toward a large diameter.

Also, in the conventional apparatus, since the vacuum vessel is grounded, the plasma is spread within the vacuum vessel of ground potential, and diffused up to the outer peripheral region so that the plasma cannot be confined enough within the processing region of the vacuum vessel's inside. Therefore, in this apparatus, the inner wall of the vacuum vessel is sputtered, thereby increasing the amount of partial produced.

In recent years, as the integration degree of semiconductor integrated circuits has been increased, the thickness of, for example, the gate oxide film of MOS (Metal Oxide Semiconductor) as a typical example of the semiconductor device has been so decreased that the gate oxide film may cause dielectric breakdown (charging damage). Moreover, as the size of semiconductor devices has become very small, the mask selectivity as represented by SAC (Self Aligned Contact) about the processing precision has been requested to improve. Also, since the generation of particle or the like within the apparatus reduces the yield and the operation rate of the apparatus, the apparatus with less particle produced is demanded.

It is the first object of the invention to provide a plasma processing method and apparatus capable of suppressing the charging damage in the plasma processing.

It is the second object of the invention to provide a plasma processing method and apparatus capable of high-precision surface treatment.

It is the third object of the invention to provide a plasma processing method and apparatus capable of reducing the amount of particle produced.

It is the fourth object of the invention to provide a plasma processing method and apparatus capable of high throughput.

The first object can be achieved by providing an electrode opposite to a substrate electrode on which a sample is placed; supplying RF power for plasma generation to the opposite electrode; and supplying, to both the electrodes, other RF power having lower frequencies than the RF power for plasma generation and opposite phases.

The other RF power of opposite phases supplied to both the electrodes have a phase difference of $180°\pm45°$.

The other RF power of opposite phases supplied to both the electrodes also have a phase difference of $180°\pm30°$.

The other RF power supplied to both the electrodes have the same frequency of 5 MHz or below.

The plasma is produced by use of RF power and magnetic field.

Moreover, the first object is achieved by providing an electrode opposite to a substrate electrode on which a sample is placed; supplying RF power for plasma generation to the opposite electrode; and supplying, to both the electrodes, other RF power having lower frequencies than the RF power for plasma generation, thereby forcing currents in the plasma to flow in the same direction between the electrodes, and thereby changing the orientation of the currents flowing in the same direction alternately toward one and the other of both the electrodes.

The frequencies of the other RF power applied to both the electrodes are made equal to be 5 MHz or below.

The first object is also achieved by providing an electrode opposite to a substrate electrode on which a sample is placed; supplying RF power for plasma generation to the opposite electrode; and supplying, to both the electrodes, other RF power having lower frequencies than the RF power for plasma generation, thereby forcing the electrons and ions from the plasma to be incident to both the electrodes in the opposite directions, respectively, and thereby alternately switching the opposite incident directions of the electrons and ions from the plasma to both the electrodes.

The frequencies of the other RF power applied to both the electrodes are made equal to be 5 MHz or below.

The second object is achieved by providing an electrode opposite to a substrate electrode on which a sample is placed; supplying RF power for plasma generation to the opposite electrode; and supplying, to both the electrodes, other RF power having lower frequencies than the RF power for plasma generation, thereby, while the ions is being incident to one of both the electrodes, forcing a number of electrons to be pulled in toward the other electrode, thereby repeating the incidence of ions and the pulling-in of electrons alternately, and thereby forcing the bias voltage waveforms produced on both the electrodes to be shifted toward the negative voltage side, thus making an ion energy distribution in which the amount of high-energy ions is large.

The frequencies of the other RF power applied to both the electrodes are made equal to be 5 MHz or below.

The third object is achieved by providing an electrode opposite to a substrate electrode on which a sample is placed; supplying RF power for plasma generation to the opposite electrode; and supplying, to both the electrodes, other RF power having lower frequencies than the RF power for plasma generation and opposite phases, thereby forcing either one of both the electrodes to always function as an earth electrode, thereby preventing the vacuum vessel from being grounded as viewed from the plasma.

The third object is also achieved by providing an electrode opposite to a substrate electrode on which a sample is placed; supplying RF power for plasma generation to the opposite electrode; and supplying, to both the electrodes, other RF power having lower frequencies than the RF power for plasma generation, thereby reducing the positive voltages of the bias voltages due to the RF voltages applied to both the electrodes to lower the plasma potential so that the potential difference is low relative to the inner wall of the vacuum vessel grounded, and thereby suppressing the ions in the plasma from making an impact to the inner wall surface of the vacuum vessel.

The fourth object is achieved by providing an electrode opposite to a substrate electrode on which a sample is placed; supplying RF power for plasma generation to the opposite electrode; supplying, to both the electrodes, other RF power having lower frequencies than the RF power for plasma generation and opposite phases during the processing of the sample; and supplying other RF power having the same phase to both the electrodes during the cleaning of the chamber's inside.

In order to achieve these objects, according to an aspect of the invention, the plasma processing apparatus includes a container of which the inside is controlled to have a predetermined pressure-reduced atmosphere; a substrate electrode provided within said container and on which a sample can be placed; an opposite electrode provided within the container to oppose the substrate electrode; a plasma generating power source connected to the opposite electrode to supply RF power thereto and to thereby generate the plasma; a plurality of biasing power supplies connected to the substrate electrode and the opposite electrode to supply thereto other RF power having lower frequencies than the RF power for plasma generation; and a phase control for controlling the phases of the RF voltages from the plurality of biasing power supplies.

In the above apparatus, the phase control controls the phases of the RF voltages to both electrodes to be opposite to each other.

The phase control also controls the phases of the RF voltages to both electrodes to be equal and opposite to each other.

The phases are controlled to have a difference of 0°±45° or 180°±45°.

The phases are also controlled to have a difference of 0°±30° or 180°±30°.

The plurality of biasing power supplies generate RF power of the same frequency of 5 MHz or below.

A field-generating coil is provided for producing magnetic field in the container.

According to another aspect of the invention, the plasma processing apparatus includes a process chamber connected to a vacuum exhauster so that the chamber's inside pressure can be reduced; a gas supplying unit for supplying gas to the process chamber; a substrate electrode provided within the process chamber and on which a sample to be processed can be placed; an antenna electrode provided to oppose the substrate electrode within the process chamber and from which electromagnetic waves for generating the plasma are radiated; a first RF power source connected to the antenna electrode to supply thereto RF power for plasma generation; a second RF power supply connected to the substrate electrode; a third RF power supply connected to the antenna electrode; and a phase control for controlling the phases of the RF voltages from the second and third RF power supplies to be opposite to each other.

According to still another aspect of the invention, the plasma processing apparatus has an electrode provided to oppose a substrate electrode on which a sample is placed; supplies RF power for plasma generation to the opposite electrode; supplies, to both electrodes, other RF power having lower frequencies than the RF power for plasma generation and opposite phases; and produces a magnetic field having lines of magnetic force passed through both electrodes.

The opposite phases of the RF power are set so that the self-bias voltage difference in the surface of the sample is 5 V or below.

The opposite phases of the RF power are also set so that the self-bias voltage difference in the surface of the sample is substantially 0 V.

According to the plasma processing of the invention, by controlling the phases of the RF power applied to the substrate electrode and the antenna electrode opposite to the substrate electrode, it is possible to lower the potential distribution in the surface of the sample to be processed due to the distribution (or uniformity) of the plasma characteristic, and to thereby suppressing the charging damage from occurring. Also, by controlling the phases of RF power, it is possible to adjust the energy of ions incident to the sample to be processed, to make etching of high aspect ratio, and to improve the mask selectivity. Therefore, high-precision etching can be performed. Moreover, by controlling the phases of the RF power, it is possible to suppress the plasma from being dispersed, and to reduce the amount of particles due to the sputtering to the inner wall of the vacuum vessel and due to the reaction products attached to or detached from the inner wall. Thus, the yield can be improved, and the maintenance period of the apparatus can be extended, so that the throughput can be improved.

DETAILED DESCRIPTION OF THE EMBODIMENTS

Figure 1:
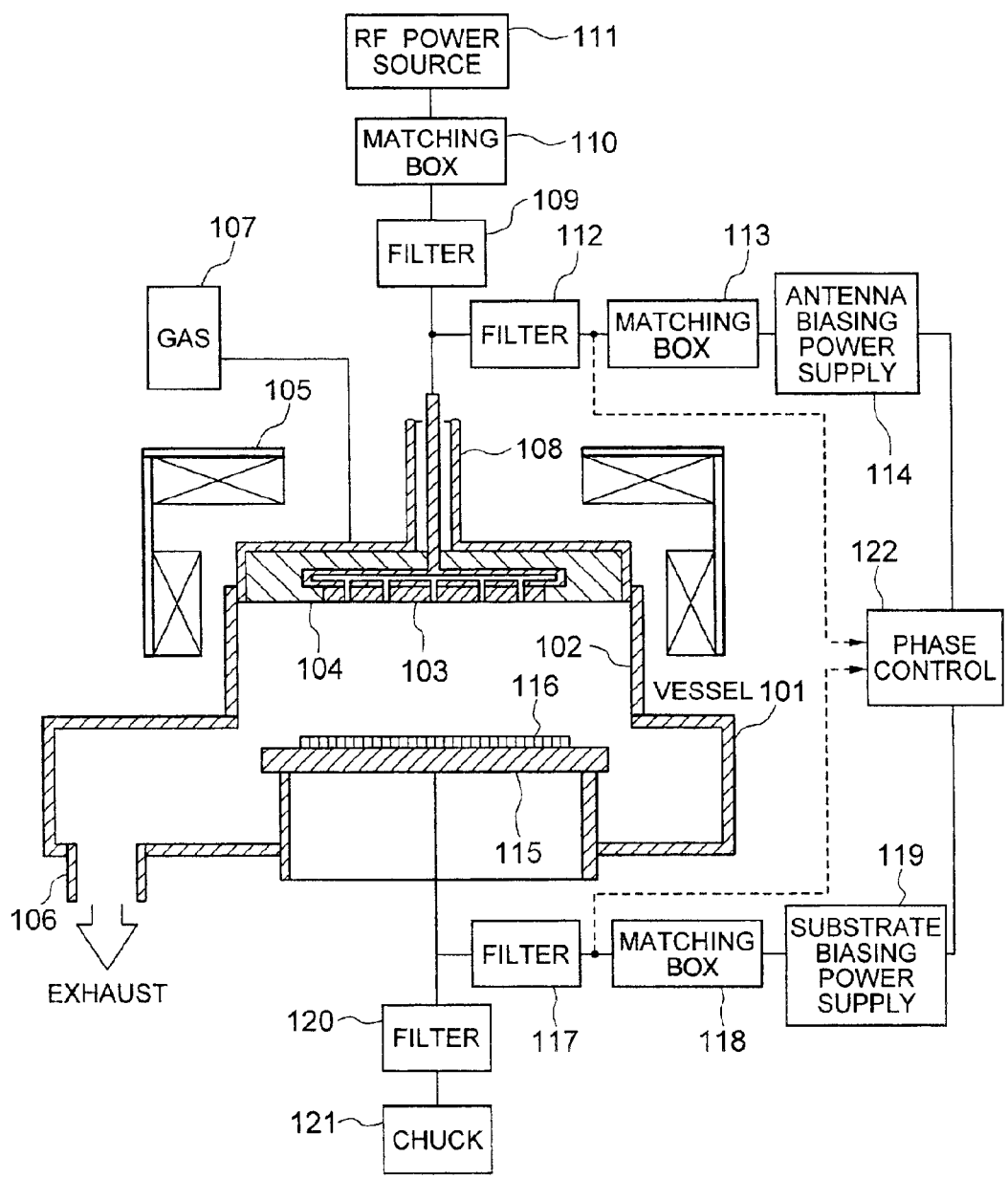
FIG. 1 is a longitudinally cross-sectional view of an etching apparatus as the first embodiment of the invention.

One embodiment of the invention will be described with reference to FIGS. 1 through 5. FIG. 1 is a longitudinally cross-sectional diagram of the etching apparatus as an example of the plasma processing apparatus to which the present invention is applied. A vacuum vessel 101 has provided on the upper opening side a cylindrical process container 102, a flat-shaped antenna electrode 103 of a conductor and a dielectric window 104 through which electromagnetic waves can be transmitted, so as to hermetically seal the top opening to form a process chamber inside the container. A field-producing coil 105 is provided around the outside of the process container 102 to surround the process chamber. The antenna electrode 103 has a perforated structure for the supply of etching gas from a gas feed unit 107 connected to the antenna electrode. In addition, below the vacuum vessel 101 there is provided a vacuum exhauster (not shown) that is connected via a vacuum vent 106 to the vessel.

A coaxial line 108 is provided on the top of the antenna electrode 103 to be connected thereto, and the coaxial line 108 is further connected via a filter 109 and a matching circuit or box 110 to an RF power source 111 (of, for example, 450 MHz in frequency) for plasma generation. The antenna electrode 103 is also connected via the coaxial line 108, a filter 112 and a matching circuit or box 113 to an antenna biasing power supply 114 (of, for example, 800 kHz in frequency). Here, the filter 109 allows the RF power to be passed therethrough from the RF power source 111, but effectively cuts off the biasing power from the antenna biasing power supply 114. The filter 112 allows the biasing power to be passed therethrough from the antenna biasing power supply, but effectively cuts off the RF power from the RF power source 111.

A substrate electrode 115 which is a so-called "sample stage" on which a sample 116 to be processed can be placed is provided on the bottom side of the inside of the vacuum vessel 101. The substrate electrode 115 is connected via a filter 117 and a matching circuit or box 118 to a substrate biasing power supply 119 (of, for example, 800 kHz in frequency). The substrate electrode 115 is also connected via a filter 120 to an electrostatic chuck power supply 121 for electrostatic suction of the sample 116. Here, the filter 117 allows the biasing power to be passed therethrough from the substrate biasing power supply 119, but effectively cuts off the RF power from the RF power source 111. Although the RF power is normally absorbed within the plasma, and thus does not flows to the substrate electrode 115 side, the filter 117 is provided for safety's sake. The filter 120 allows the DC power to be passed therethrough from the electrostatic chuck power supply 121, but effectively cuts off the power from the RF power source 111, antenna biasing power supply 114 and substrate biasing power supply 119.

The antenna biasing power supply 114 and the substrate biasing power supply 119 are connected to a phase controller 122 that controls the phases of the voltages from those power supplies 114, 119. In this case, the frequencies of the voltages from the power supplies 114, 119 are the same.

The phase controller 122 responds to the voltage waveforms from the junction between the filter 112 and matching circuit 113 on the antenna biasing power supply 114 side and from the junction between the filter 117 and matching circuit 118 on the substrate biasing power supply 119 side to produce signals with a small amplitude so that the desired phase difference of those signals can be kept opposite, or 180°±45°, and to supply those signals to the antenna biasing power supply 114 and the substrate biasing power supply 119, respectively. In this case, the antenna biasing power supply 114 and the substrate biasing power supply may only function as amplifiers, respectively.

If the phase controller 122 responds to the voltage waveforms from the junction between the filter 112 and matching circuit 113 on the antenna biasing power supply 114 side and from the junction between the filter 117 and matching circuit 118 on the substrate biasing power supply 119 side to produce only trigger signals that support the output timing of the power, the antenna biasing power supply 114 and the substrate biasing power supply 119 function as oscillators, respectively.

In the apparatus constructed as above, after the inside pressure of the process chamber is reduced by the vacuum exhauster (not shown), the gas feed unit 107 supplies etching gas into the process chamber until the pressure within the chamber can be adjusted to be a desired value. The oscillation output, or an RF power of, for example, 450 MHz from the RF power source 111 is propagated through the coaxial line 108, the top electrode, or antenna electrode 103 and the dielectric window 104, and introduced into the process chamber. The electric field produced by the introduced RF power in the chamber, and the magnetic field produced by the field-producing coil 105 (for example, solenoid coil) in the chamber interact with each other to generate a high-density plasma in the chamber. Particularly when the intensity of magnetic field produced in the chamber is a value (for example, 160 G where the frequency of plasma-producing RF power source is 450 MHz) that causes electron cyclotron resonance, the high-density plasma can be effectively produced. Also, the RF power (of, for example, 800 kHz in frequency) from the antenna biasing power supply 114 is supplied through the coaxial line 108 to the antenna electrode 103. Moreover, the RF power (of, for example, 800 kHz in frequency) from the substrate biasing power supply 119 is supplied to the sample 116 placed on the substrate electrode 115, so that the surface of the sample is processed (for example, etched).

When the RF voltage from the antenna biasing power supply 114 is applied to the antenna electrode 103 that is made of a desired material, this material reacts with the radicals in the plasma, so that the constituents of the produced plasma can be controlled. In the case of, for example, oxide film etching, if silicon Si is used for the material of the antenna electrode 103, the amount of F-radical in the plasma can be reduced that affects the etching characteristic on the oxide film, or particularly the $SiO_2/SiN$ selectivity.

In this apparatus, the plasma is produced chiefly by the RF power source 111 of 450 MHz, the plasma constituents or plasma distribution is controlled by the antenna biasing power supply 114, and the energy of ions of the plasma incident to the sample 116 is controlled by the substrate biasing power supply 119. Thus, this apparatus has the merit that the plasma generation (amount of ions) and plasma constituent (radical concentration ratio) can be independently controlled.

In general, a potential distribution may be formed on the sample to be processed by the influence of differences of plasma characteristic in the surface, causing the charging damage in the plasma. If a voltage of about 5 V or above is applied across the gate oxide film of a semiconductor device having a film thickness of 4.5 nm, the gate oxide film is deteriorated. Therefore, in order to suppress the charging damage, it is necessary that the voltage across the gate oxide film be reduced to less than 5 V.

Figure 2:
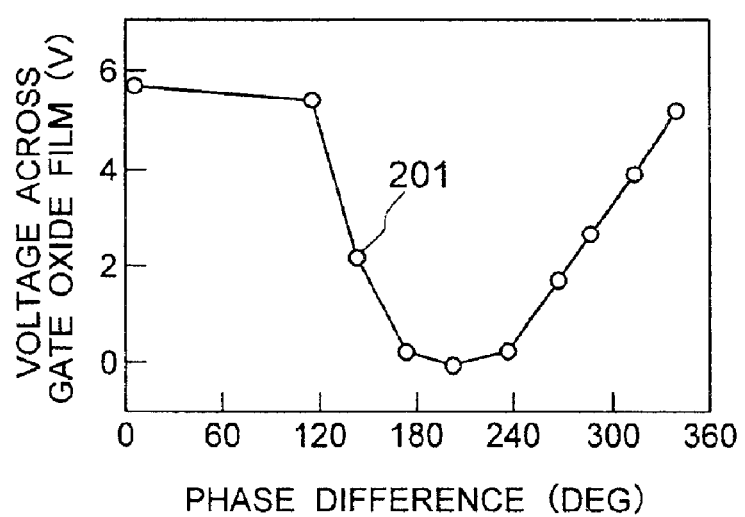
FIG. 2 is a graph showing the relation of the voltage across the gate oxide film to the phase difference between RF voltages.

FIG. 2 is a graph showing the relation of the phase difference of the RF voltages applied to the substrate electrode 115 and antenna electrode 103 and the voltage developed across the gate oxide film. In FIG. 2, the ordinate shows the voltage across the gate oxide film, and the abscissa the phase difference of the RF voltages. From FIG. 2, it will be understood that the voltage across the gate oxide film is about 6 V when the phase difference is around 0°, but can be restricted to as small as a tolerance or below when the phase difference is kept around 180°, or in the range of 180°±45°. If the phase difference is preferably in the range of 180°±30°, the voltage across the gate oxide film can be more effectively kept about 2 V or below.

Figure 3A:
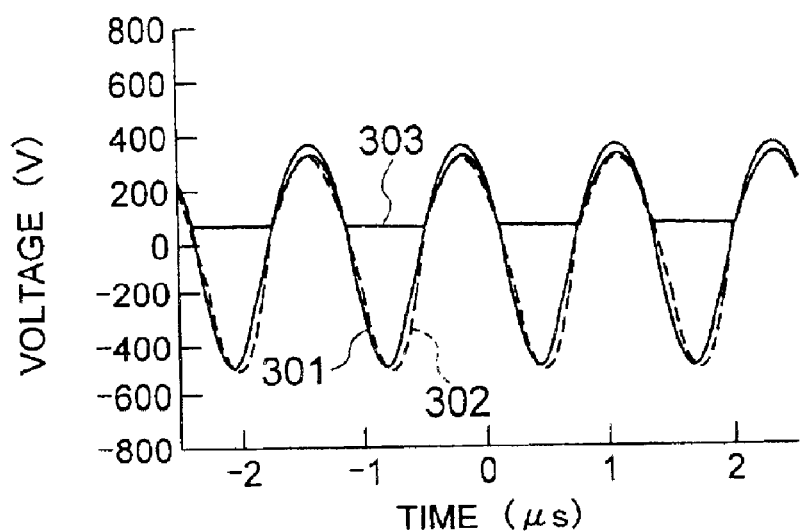
FIGS. 3A and 3B are diagrams showing the waveforms of voltages at the substrate/antenna electrodes when the bias voltages of the same frequency are applied to the substrate electrode and antenna electrode.
Figure 3B:
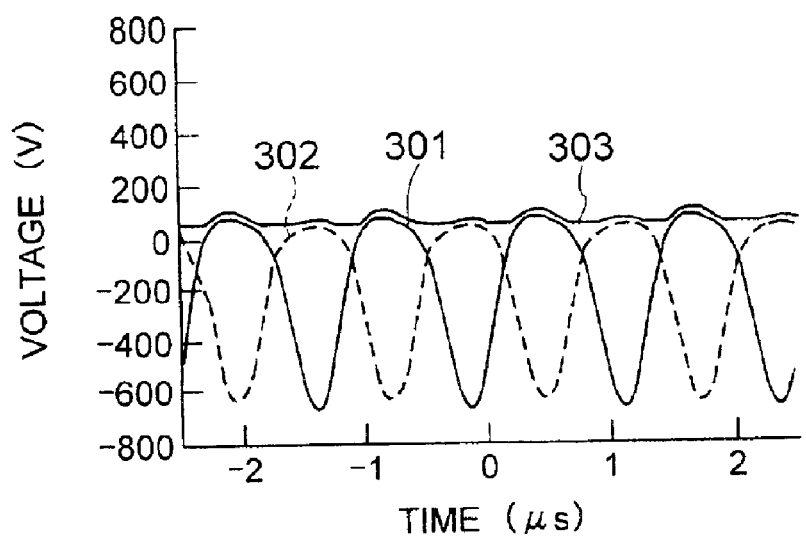

FIGS. 3A and 3B are diagrams showing a substrate voltage waveform 301, an antenna voltage waveform 302 and a plasma potential waveform 303 when the phases of the RF voltages applied to the substrate electrode 115 and the antenna electrode 103 are selected to be equal and opposite, respectively. From FIG. 3A, it will be seen that, when the voltages of RF power are applied in phase, both substrate voltage waveform 301 and antenna voltage waveform 302 are sinusoidal. In addition, the plasma potential waveform 303 has an oscillation of a large amplitude on the positive potential side. On the other hand, as shown in FIG. 3B, when the voltages of the RF power are applied 180° out of phase, both voltage waveforms 301, 302 are shifted to the negative voltage side, and distorted to flatten on the positive voltage side. Thus, the plasma potential waveform 303 is also flattened to still have a small potential. From the above facts, it will be understood that when the RF voltages are applied 180° out of phase, the resulting self bias potential is large, or increases as compared with the case when the RF voltages are applied in phase.

Figure 4A:
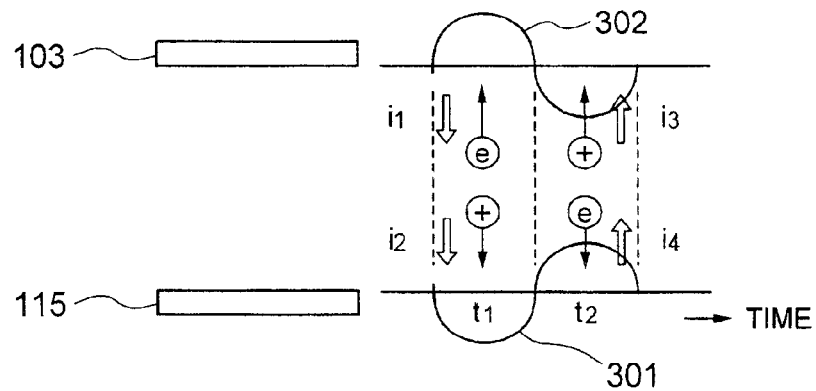
FIGS. 4A, 4B and 4C are diagrams showing the relation of the RF voltages applied to the substrate electrode and antenna electrode and the movement of ions and electrons in the plasma.

The reason for this will be probably the fact that the electrodes that are opposed to each other are improved in their earth function so that enough currents can be supplied between both the electrodes. In other words, as shown in FIG. 4A, the antenna voltage waveform 302 of antenna electrode 103 takes positive potential during a time $t_1$ in which the electrons in the plasma are pulled in toward the antenna electrode, and negative potential during a time $t_2$ in which the ions in the plasma are pulled in. On the contrary, the substrate voltage waveform 301 of substrate electrode 115 takes negative potential during time $t_1$ in which the ions in the plasma are pulled in toward the substrate electrode, and positive potential during time $t_2$ in which the electrons in the plasma are pulled in. Therefore, since the plasma space has flow of currents ($i_1$, $i_2$) toward the substrate electrode during time $t_1$, and of currents ($i_3$, $i_4$) toward the antenna electrode during time $t_2$, sufficient electrons are supplied when both the substrate electrode and the antenna electrode are in phase to the positive voltage side, shifting it to the negative voltage side. In addition, since those currents flow in the same direction, either one of both the electrodes always effectively functions as an earth electrode to lower the plasma potential so that the plasma potential can be flattened to be low.

Figure 4B:
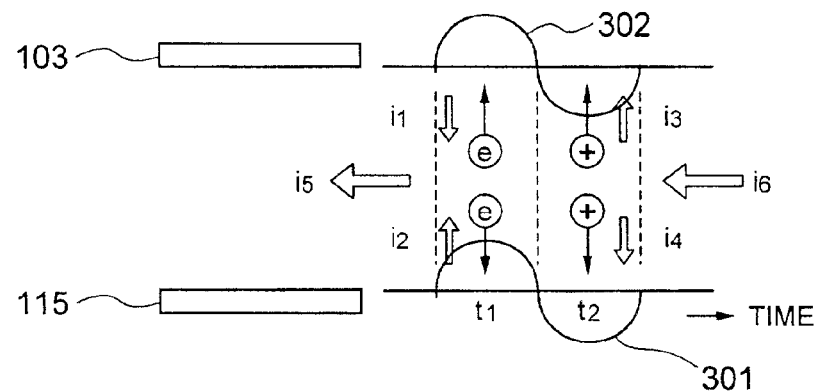
Figure 4C:
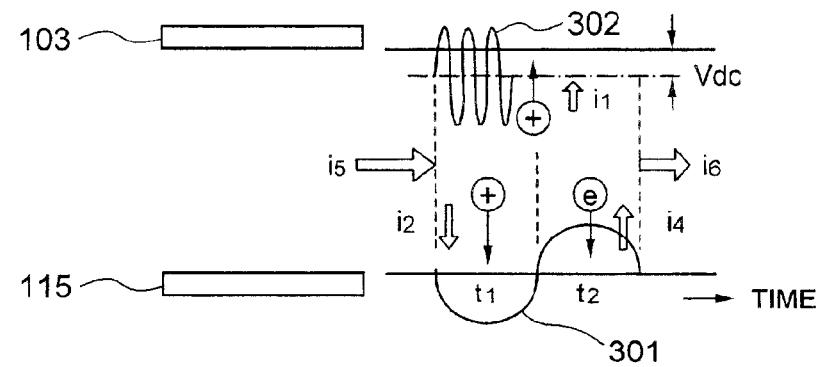

As shown in FIG. 4B, when the antenna voltage waveform 302 and the substrate voltage waveform 301 are applied in phase, the plasma space has flow of currents ($i_1$, $i_2$, $i_3$, $i_4$) in opposite directions toward the electrodes, and thus the electric path is formed between the process chamber 102 grounded and each of the electrodes so that currents ($t_5$, $i_6$) flow to the inner wall of the chamber. As shown in FIG. 4C, if the substrate voltage waveform 301 of substrate electrode 115 remains the same as in FIG. 4A, but if the antenna voltage waveform 302 of, for example, 13.56 MHz in frequency is applied to the antenna electrode 103, a self-bias voltage $V_{dc}$ is produced on the antenna electrode 103 side, so that the ions in the plasma are always pulled in toward the antenna electrode. During time $t_1$, currents ($i_1$, $i_2$) flow in the opposite directions toward both electrodes. Therefore, an electric path is formed between the process chamber 102 and each of the electrodes, so that the current $i_5$ flows from the chamber side to both electrodes. During time $t_2$, the currents flow in the same direction toward the antenna electrode 103, but the difference ($i_6$) between the currents toward the antenna electrode 103 and substrate electrode 115 flows to the chamber 102 side.

Since more RF current flows between both the electrodes than to and from the side wall in the apparatus of this embodiment, the current flowing across the magnetic field decreases, so that the charging damage can be suppressed from occurrence. Therefore, when the phase difference of RF voltages to be applied to both electrodes is kept around 180° as shown in FIG. 2, the charging damage can be suppressed from occurrence, so that the process for high yield can be carried out.

Figure 5:
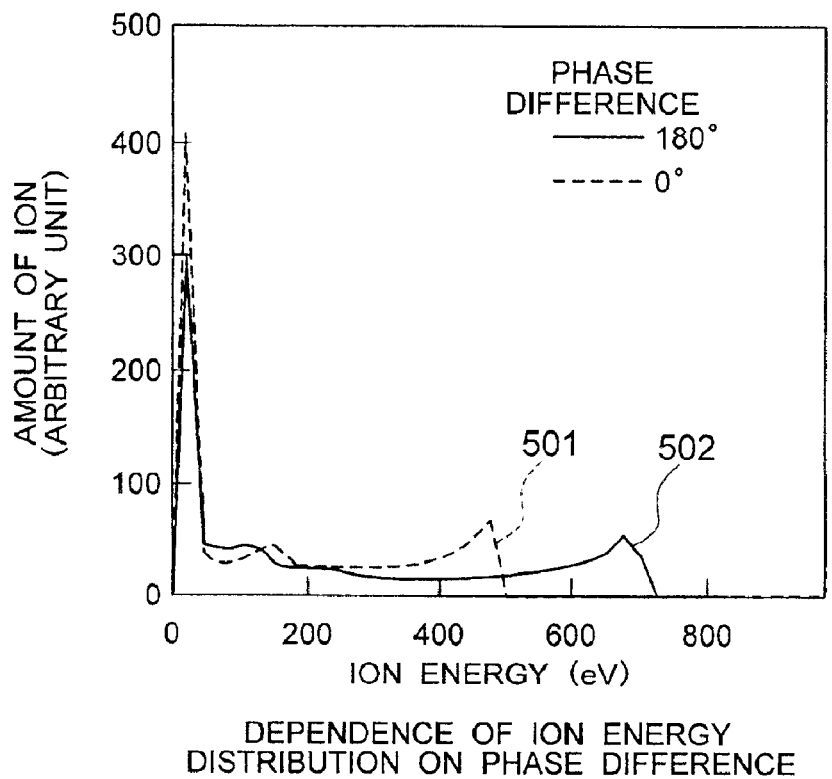
FIG. 5 is a diagram showing the energy distribution of ions that are incident to the electrodes with the phase difference of voltages changed to be 0° and 180°.

FIG. 5 is a graph showing the distributions of energy of ions incident to both electrodes when the RF voltages to both electrodes are applied in phase (0°) as indicated by a broken line (501) and 180° out of phase as by a solid line (502). From FIG. 5, it will be understood that, when the RF voltages are applied 180° out of phase, the amount of ions is reduced in the low energy region but increases in the high energy region as a result of shifting to a higher energy value as compared with the case when the RF voltages are applied in phase. Although the energy of ions incident to the sample to be processed 116 is determined by the self-bias potential produced at the substrate electrode 115, the phases of the RF power to the antenna electrode 103 and substrate electrode 115 in this embodiment are made 180° out of phase as shown in FIG. 3B, thereby making it possible to increase the amount of high-energy ions as shown in FIG. 5. In other words, since the self-bias potential can be further increased, the high-aspect-ratio holes can be processed with high precision performance. Moreover, the most appropriate etched shape can be obtained by effective application of power.

In addition, the self-bias potential can be feely controlled even by controlling the phases of the RF power to the antenna electrode 103 and the substrate electrode 115, and thus the range of the processing conditions can be widened.

Figure 6:
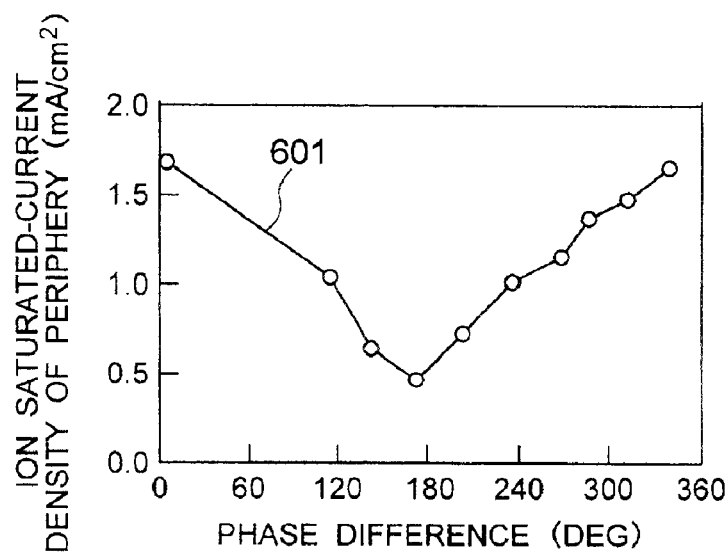
FIG. 6 is a graph showing the relation of the ion saturated current density of the outer periphery and the phase difference.

FIG. 6 is a graph showing the relation of the ion saturated-current density (as indicated by 601) measured on the outer periphery of the substrate electrode 115, and the phase difference between the RF voltages. From FIG. 6, it will be understood that on the outer periphery of the substrate electrode 115 the plasma density is high when the RF voltages are applied in phase but low when the RF voltages are applied 180° out of phase. That is, when the phase difference between the RF voltages to the electrodes are made around 180°, either one of the electrodes always efficiently serves as earth electrode, and thus the plasma potential can be suppressed from rising. As a result, the potential difference between the plasma, and the inner walls of the grounded process container 102 and vacuum vessel 101 decreases, so that the plasma produced inside the process container 102 is not expanded to the inner walls of the process container 102 and vacuum vessel 101. In other words, the plasma can be efficiently confined within the process container 102.

The vacuum vessel 101 and process container 102 grounded are generally sputtered with the plasma, and the reaction products are attached or detached to or from the inner walls thereof, thus acting as sources of particles that lowers the throughput. However, in this embodiment, since the plasma can be efficiently confined within the process container when the phase difference between the RF voltages are selected to be about 180° as shown in FIG. 6, the reaction products can be suppressed from being attached to the inner walls of the vacuum vessel 101, and the variation of the plasma potential 303 can be reduced as shown in FIG. 3B. Therefore, the degree of sputtering by ion bombardment to the vacuum vessel 101 and process container 102 can be weakened. Thus, since the generation of particles from the vacuum vessel 101 and process container 102 can be suppressed, the maintenance period of the apparatus can be extended, and the throughput can be improved.

Figure 7:
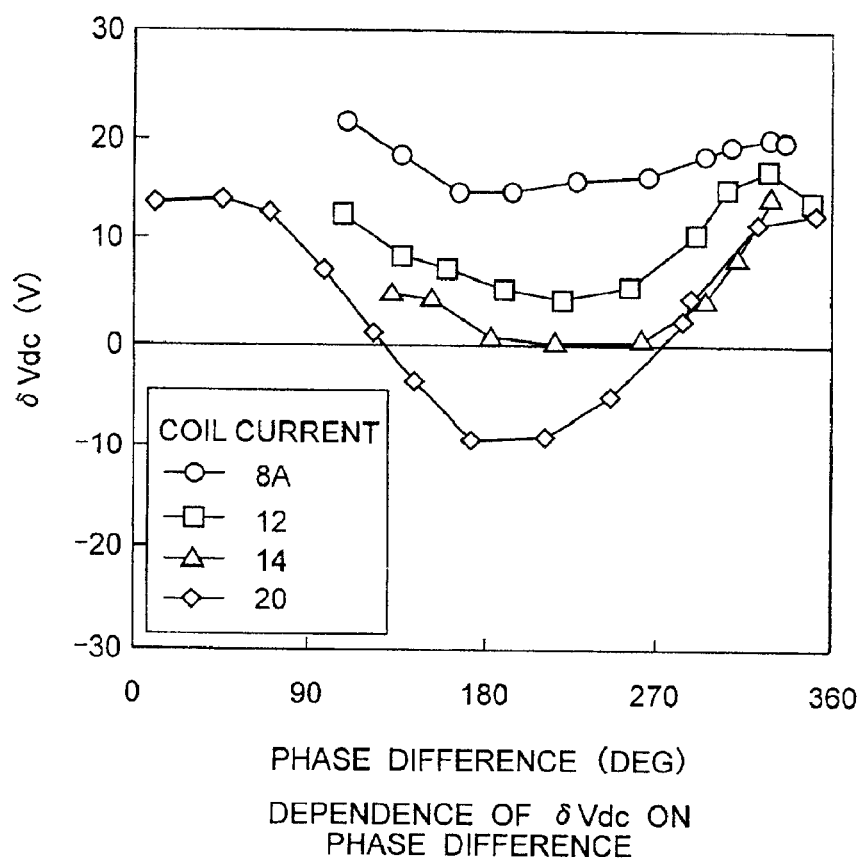
FIG. 7 is a graph showing the relation of the phase difference of bias voltages and the self-bias voltage difference in the substrate surface with the magnetic field intensity changed.

In addition, according to this embodiment, a diverging magnetic field directed toward the substrate electrode 115 from the antenna electrode 103 is produced within the process chamber by the field generation coil 105. Thus, since the electrons in the plasma are moved under the control of the magnetic field, the RF current flowing out of one electrode efficiently flows toward the other opposite electrode rather than flowing toward the side wall of the chamber. Therefore, the self-bias voltage difference ($\delta V_{dc}$) can be reduced that is produced in the surface of the substrate electrode in association with the charging damage. FIG. 7 is a graph showing the relation of the phase difference of the bias voltages and the self-bias voltage difference between the self-bias voltages produced at the central and peripheral portions of the substrate electrode ($\delta V_{dc} = V_{dc}$ at the center- $V_{dc}$ at the periphery) with the intensity of the magnetic field by the coil 105 changed. From FIG. 7, it will be understood that there are values of the coil current and values of the phase difference between the bias voltages at which values the self-bias voltage difference ($\delta V_{dc}$) can be made zero by increasing the current to the field-generating coil, or the vertical component. Accordingly, if the vertical component of the magnetic field with respect to the sample to be processed 116 can be much produced in the chamber by the coil 105, the diffusion of the plasma can be effectively suppressed even if the distance between both the electrodes is large (for example, 30 mm or above).

Also, even by using the field shape in which the field intensity is increased as one proceeds toward the outer periphery from the center in the process chamber, it is possible to suppress the electrons from moving toward the outer periphery of the chamber. Therefore, the RF current flowing out of one electrode flows toward the opposite electrode rather than flowing toward the side wall of the chamber, and thus the same effect can be achieved. This magnetic field can be produced even by use of cusp field from an electromagnetic coil or cusp field from a permanent magnet.

The processing of the sample by the plasma in the above embodiment has been described above. When the inner wall within the apparatus is cleaned by the plasma, the phase difference between the RF voltages to the electrodes is made 0° (in phase), thereby making it possible to disperse the plasma widely and efficiently give bombardment of ions on the wall, and thus the cleaning effect can be improved.

The same effects can be expected if the phases of the RF voltages applied to the antenna electrode 103 and substrate electrode 115 are opposite, or have a difference of about 180°±45°, preferably 180°±30° or if the phases of the RF voltages thereto are the same, or have a difference of about 0°±45°, preferably 0°±30°.

An example of the etching apparatus using magnetic field in this embodiment has been described above. The present invention can also be applied to an etching apparatus not using magnetic field, and other plasma processing apparatus than the etching apparatus, such as ashing apparatus and plasma CVD apparatus in which RF power is supplied to the substrate electrode.

While the frequency of the RF voltages to the antenna electrode 103 and substrate electrode 115 in this embodiment is 800 kHz as described above, an RF power supply of a frequency at which the sheath becomes resistive, or about 5 MHz or below can be used to achieve the same effect.

Moreover, while the voltage signals are taken out of the junctions of the filters 112, 117 and the matching circuits 113, 118 in this embodiment, they may be obtained from the output portions of the matching circuits 113, 118. Although the best effect can be achieved if the voltage signals for phase control are detected at the electrodes, in order to remove other RF voltage noise it is desirable to detect them at least through filters. In addition, since the phases of the RF voltages at the output portions of the antenna biasing power supply 114 and substrate biasing power supply 119 are not coincident with those of the RF voltages at the electrodes 103, 115, it is desirable to detect them as near to the electrodes as possible.

Thus, according to the invention, by controlling the phases of the RF bias voltages applied to the substrate electrode and the electrode opposite thereto, it is possible to reduce the current flowing between each of both the electrodes and the inner wall of the vessel, to lower the potential difference of the potential distribution in the surface of the sample to be processed due to the distribution of the plasma characteristic in the surface, and thus to suppress the charging damage from occurring. Therefore, the yield of the sample can be improved.

In addition, since the energy of ions incident to the sample to be processed can be freely controlled by controlling the phases of the RF bias voltages, high-precision etching can be performed.

Also, since the plasma density near the inner wall of the vessel and the bombardment of ions to the wall can be more freely controlled by controlling the phases of the RF bias voltages, the occurrence of particles from the inner wall of the apparatus can be suppressed, and thus the cleaning period can be extended, leading to the improvement of throughput.

Furthermore, by controlling the phases of the RF bias voltages, it is possible to make efficient cleaning within the vessel.

What is claimed is:

1. A plasma processing method for processing plasma in a plasma processing apparatus having a vacuum vessel, said plasma processing method comprising:

placing a sample on a substrate electrode inside the vacuum vessel;

providing an antenna electrode arranged opposite to an upper face of said substrate electrode on which the sample is placed;

supplying an RF power to said antenna electrode opposite to said substrate electrode for plasma generation in the vacuum vessel; and supplying, to both said antenna electrode and said substrate electrode respectively, other RF powers having the same frequency lower than that of said RF power for plasma generation and having opposite phases to each other.

2. A plasma processing method according to claim 1, wherein said opposite phases of said other RF powers to be applied to both said antenna electrode and said substrate electrode have a difference of 180°±45°.

3. A plasma processing method according to claim 2, wherein said opposite phases of said other RF powers to be applied to both said antenna electrode and said substrate electrode have a difference of 180°±30°.

4. A plasma processing method according to claim 1, wherein said other RF powers to be applied to both said antenna electrode and said substrate electrode have the same frequency of 5 MHz or below.

5. A plasma processing method according to claim 1, wherein said plasma is generated by application of said RF power and by generation of a magnetic field.

6. A plasma processing method for processing plasma in a plasma processing apparatus having a vacuum vessel, said plasma processing method comprising:

placing a sample on a substrate electrode inside the vacuum vessel;

providing an antenna electrode arranged opposite to an upper face of said substrate electrode on which the sample is placed;

supplying an RF power to said antenna electrode for plasma generation in the vacuum vessel; and supplying, to both said antenna electrode and said substrate electrode, other RF powers having the same frequency lower than that of said RF power for plasma generation, such that currents flow in said plasma in the same direction between both said antenna electrode and said substrate electrode, and the direction of said current flow changes toward one and the other of both said antenna and substrate electrodes, alternately.

7. A plasma processing method according to claim 6, wherein said other RF powers applied to both said antenna and substrate electrodes have the same frequency of 5 MHz or below.

8. A plasma processing method for processing plasma in a plasma processing apparatus having a vacuum vessel, said plasma processing method comprising:

placing a sample on a substrate electrode inside the vacuum vessel;

providing an antenna electrode arranged opposite to an upper face of said substrate electrode on which the sample is placed;

supplying an RF power to said antenna electrode for plasma generation in the vacuum vessel; and supplying, to both said antenna and substrate electrodes, other RF powers having the same frequency lower than that of said RF power for plasma generations, such that directions of incidence of electrons and ions from said plasma to both said antenna and substrate electrodes are forced to be opposite to each other and said directions of incidence of electrons and ions from said plasma are changed to both said antenna and substrate electrodes alternately.

9. A plasma processing method according to claim 8, wherein said other RF powers to be supplied to both said antenna and substrate electrodes have the same frequency of 5 MHz or below.

10. A plasma processing method for processing plasma in a plasma processing apparatus having a vacuum vessel, said plasma processing method comprising:

placing a sample on a substrate electrode inside the vacuum vessel;

providing an antenna electrode arranged opposite to an upper face of said substrate electrode on which the sample is placed;

supplying an RF power for plasma generation to said antenna electrode; and supplying, to both said antenna and substrate electrodes, other RF powers having the same frequency lower than that of said RF power for plasma generation such that, while ions are being incident to one of both said antenna and substrate electrodes, a large number of electrons are pulled in the other, said incidence of ions and pulling-in of electrons are repeated alternately, and bias voltage waveforms caused on both said antenna and substrate electrodes are shifted to a negative voltage side to generate an ion energy distribution in which an amount of high-energy ion is large.

11. A plasma processing method according to claim 10, wherein said other RF powers to be applied to both said antenna and substrate electrodes have the same frequency of 5 MHz or below.

12. A plasma processing method for processing plasma in a plasma processing apparatus having a vacuum vessel, said plasma processing method comprising the steps of:

placing a sample on a substrate electrode inside the vacuum vessel;

providing an antenna electrode arranged opposite to an upper face of said substrate electrode on which the sample is placed;

supplying an RF power for plasma generation to said antenna electrode;

supplying, to both said antenna and substrate electrodes, other RF powers having the same frequency lower than that of said RF power for plasma generation and having opposite phases, and forcing either one of both said antenna and substrate electrodes to always function as an earth electrode, so that the vacuum vessel is suppressed from being grounded as viewed from said plasma.

13. A plasma processing method for processing plasma in a plasma processing apparatus having a vacuum vessel, said plasma processing method comprising:

placing a sample on a substrate electrode inside the vacuum vessel;

providing an antenna electrode opposite to an upper face of said substrate electrode on which the sample is placed;

supplying an RF power for plasma generation to said antenna electrode;

supplying, to both said antenna and substrate electrodes, other RF powers having the same frequency lower than that of said RF power for plasma generation; and decreasing positive voltages of RF bias voltages of said RF powers applied to both said antenna and substrate electrodes to lower a plasma potential and to thereby reduce the potential difference relative to an inner wall of the vacuum vessel grounded, so that ions in said plasma can be suppressed from bombardment to an inner wall surface of the vacuum vessel.

14. A plasma processing method for processing plasma in a plasma processing apparatus having a vacuum vessel, said plasma processing method comprising:

placing a sample on a substrate electrode inside the vacuum vessel;

providing an antenna electrode arranged opposite to an upper face of said substrate electrode on which the sample is placed;

supplying an RF power for plasma generation to said antenna electrode;

supplying, to both said antenna and substrate electrodes, other RF powers having the same frequency lower than that of said RF power for plasma generation and having opposite phases, while the sample is being processed in the vacuum vessel; and supplying, to both said antenna and substrate electrodes, other RF powers having the same phase, while the inside of the vacuum vessel is being cleaned.

15. A plasma processing method for processing plasma in a plasma processing apparatus having a chamber, said plasma processing method comprising:

placing a sample on a lower electrode inside the chamber;

providing an upper electrode arranged opposite to an upper face of said lower electrode on which the sample is placed;

supplying an RF power for plasma generation to said upper electrode;

supplying, to both said upper and lower electrodes, other RF powers having the same frequency lower than that of said RF power for plasma generation and having opposite phases; and producing a magnetic field having lines of magnetic force passed through said upper and lower electrodes.

16. A plasma processing method according to claim 15, wherein said phases of said RF powers that are opposed to each other are set so that a self-bias voltage difference in a surface of said sample is 5 V or below.

17. A plasma processing method according to claim 15, wherein said phases of said RF powers that are opposed to each other are set so that a self-bias voltage difference in a surface of said sample is substantially 0 V.

* * * * *